United States Patent
Bambridge et al.

(10) Patent No.: US 7,215,204 B2
(45) Date of Patent: May 8, 2007

(54) INTELLIGENT HIGH-POWER AMPLIFIER MODULE

(75) Inventors: Timothy B. Bambridge, Pittstown, NJ (US); Juan A. Herbsommer, Schnecksville, PA (US); Osvaldo Lopez, Lebanon, NJ (US); Joel M. Lott, Quakertown, PA (US); Khanh C. Nguyen, Macungie, PA (US)

(73) Assignee: Agere Systems Inc., Allentown, PA (US)

( * ) Notice: Subject to any disclaimer, the term of this patent is extended or adjusted under 35 U.S.C. 154(b) by 89 days.

(21) Appl. No.: 11/055,711

(22) Filed: Feb. 10, 2005

(65) Prior Publication Data

US 2006/0139089 A1 Jun. 29, 2006

Related U.S. Application Data

(60) Provisional application No. 60/640,176, filed on Dec. 29, 2004.

(51) Int. Cl.
  *H03F 3/14* (2006.01)
  *H05K 1/18* (2006.01)

(52) U.S. Cl. ...................... 330/307; 361/764

(58) Field of Classification Search ............... None
  See application file for complete search history.

(56) References Cited

U.S. PATENT DOCUMENTS

| | | | |
|---|---|---|---|
| 3,735,255 A * | 5/1973 | Goldman | 324/73.1 |
| 4,078,208 A * | 3/1978 | Hart et al. | 330/296 |
| 4,975,659 A | 12/1990 | Butler et al. | 330/307 |
| 5,583,377 A | 12/1996 | Higgins, III | 257/707 |
| 5,835,352 A | 11/1998 | Matsuzaki et al. | 361/707 |
| 5,856,911 A | 1/1999 | Riley | 361/704 |
| 5,991,156 A | 11/1999 | Bond et al. | 361/707 |
| 6,208,210 B1 * | 3/2001 | Bartola | 330/286 |
| 6,249,052 B1 | 6/2001 | Lin | 257/737 |
| 6,330,165 B1 * | 12/2001 | Kohjiro et al. | 361/760 |
| 6,545,351 B1 | 4/2003 | Jamieson et al. | 257/712 |
| 6,628,526 B1 * | 9/2003 | Oshima et al. | 361/760 |
| 6,714,420 B2 * | 3/2004 | Yoshisato et al. | 361/760 |
| 6,757,176 B1 * | 6/2004 | Jiang et al. | 361/784 |
| 6,759,902 B2 * | 7/2004 | Kossor | 330/136 |
| 6,842,341 B1 * | 1/2005 | Waldvogel et al. | 361/704 |
| 2002/0134993 A1 | 9/2002 | Leighton et al. | 257/177 |
| 2003/0076173 A1 | 4/2003 | Moller et al. | 330/295 |
| 2004/0212081 A1 | 10/2004 | Carberry et al. | 257/717 |

FOREIGN PATENT DOCUMENTS

| | | |
|---|---|---|
| DE | 196 01 649 A 1 | 7/1997 |
| EP | 0 124 029 A2 | 11/1984 |
| EP | 1 427 013 A2 | 6/2004 |

* cited by examiner

*Primary Examiner*—Robert Pascal
*Assistant Examiner*—Krista Flanagan

(57) ABSTRACT

An amplifier module has a substrate, as assembly having one or more integrated circuit (IC) dies mounted to the substrate, and one or more other electronic components mounted to the substrate. The assembly receives an input signal and generates an amplified output signal. The one or more other electronic components perform one or more amplifier-related functions. The amplifier module is adapted to be mounted to a circuit board (CB) as a distinct electronic package. The invention may be implemented as an electronic system having the CB and at least one such amplifier module mounted to the CB.

22 Claims, 8 Drawing Sheets

1100

| ROW # | DRAIN CURRENT (mA) | JUNCTION TEMPERATURE (DEGREES C) | VGS (V) |
|---|---|---|---|
| 1 | 398 | 30 | 3.9 |
| 2 | 398 | 35 | 3.7 |
| 3 | 398 | 40 | 3.5 |
| 4 | 398 | 45 | 3.3 |
| 5 | 398 | 50 | 3.1 |
| 6 | 400 | 30 | 4.0 |
| 7 | 400 | 35 | 3.8 |
| 8 | 400 | 40 | 3.6 |
| 9 | 400 | 45 | 3.4 |
| 10 | 400 | 50 | 3.2 |
| 11 | 403 | 30 | 4.1 |
| 12 | 403 | 35 | 3.9 |
| 13 | 403 | 40 | 3.7 |
| 14 | 403 | 45 | 3.5 |
| 15 | 403 | 50 | 3.3 |

(rows 6–10 grouped as 1102)

INTELLIGENT HIGH-POWER AMPLIFIER MODULE

CROSS-REFERENCE TO RELATED APPLICATIONS

This application claims the benefit of the filing date of U.S. provisional application No. 60/640,176, filed on Dec. 29, 2004, the teachings of which are incorporated herein by reference.

The subject matter of this application is related to the subject matter of U.S. application Ser. No. 11/055,712 filed on the same date as this application, the teachings of which are incorporated herein by reference.

BACKGROUND OF THE INVENTION

1. Field of the Invention

The present invention relates to electronics, and, in particular, to the packaging and configuration of electronic components, such as high-power amplifiers, into electronic modules.

2. Description of the Related Art

The cellular and personal communication systems market continues to move toward second-and third-generation wireless interfaces such as generalized packet radio service (GPRS), CDMA2000, and wideband CDMA (WCDMA). To meet the needs of these markets, radio-frequency (e.g., 400 MHz to 3 GHz) high-power (e.g., 30 W to 300 W or more) amplifiers (HPAs) are being designed to be smaller, more efficient, lower cost, and easier to manufacture. The power gain, output power, efficiency, and linearity of HPAs are key parameters that affect the overall performance and cost effectiveness of these communications systems.

A number of factors present challenges to the designers of HPA circuits. These include thermal management, the control of quiescent currents and package parasitics, compensating for non-linear characteristics of gain as a function of input power, temperature, and/or bias, and impedance matching.

In order to avoid permanent damage to the electronic component itself as well as to surrounding elements, an electronic component that generates a relatively large amount of heat, such as a power amplifier, is typically assembled in a package that has one or more heat sinks that help dissipate the heat generated during operation of the electronic component.

FIGS. 1A and 1B show isometric and cross-sectional views of a prior-art HPA package 100. HPA package 100 houses a high-power amplifier implemented using six integrated circuit (IC) dies: two input dies 102, two amplifier dies 104, and two output dies 106, where dies 102a, 104a, and 106a are electrically interconnected in series via wire bonds 108, dies 102b, 104b, and 106b are electrically interconnected in series via other wire bonds 108, and each die may include thousands of integrated devices. For example, each amplifier die 104 typically includes thousands of transistors configured in parallel. Input dies 102 are also electrically connected to a single input conductor 110 via wire bonds, and output dies 106 are also electrically connected to a single output conductor 112 via wire bonds.

In operation, a single, low-power electrical input signal is applied to HPA package 100 at input conductor 110, which passes the input signal to input dies 102. Input dies 102 condition the input signal and apply the conditioned input signals to amplifier dies 104. Amplifier dies 104 amplify the conditioned input signals and apply the resulting high-power signals to output dies 106. Output dies 106 condition the high-power signals and apply the conditioned, high-power signals to output conductor 112, which presents the conditioned, high-power signals as a single high-power electrical output signal from HPA package 100.

During operation, dies 102–106 generate a relatively large amount of heat that needs to be removed from the dies and dissipated in order avoid damaging elements within HPA package 100 as well as other components near HPA package 100. To achieve this thermal control, dies 102–106 are mounted directly to a metal carrier 114, e.g., using an electrically and thermally conducting solder material, to form a die/carrier assembly. In addition to functioning as a heat sink that conducts heat away from the dies, the electrically conducting metal carrier 114 also functions as a base conductor for HPA package 100 that provides the substrate voltage (e.g., ground or drain voltage) for the dies.

This die/carrier assembly is itself mounted within a package body 116 to form an HPA package that is then solder-mounted onto a metal chassis having heat-radiating fins (not shown). In order to withstand the temperatures associated with the solder-mounting of the HPA package onto the metal chassis, package body 116 is typically made from a heat-resistant ceramic material or a high-temperature liquid crystal polymer material. In order to avoid damage resulting from different thermal expansion properties, carrier 114 is typically made from a metal, such as a copper tungsten alloy, whose coefficient of expansion substantially matches that of the package body's ceramic material.

Although the design of HPA package 100 provides thermal management for the HPA circuitry, it does not address other design goals for high-power amplifiers such as the control of quiescent currents and package parasitics, compensating for non-linear characteristics of gain as a function of input power, temperature, and/or bias, and impedance matching. In order to address these goals, HPA package 100 is typically mounted on a circuit board (CB) that contains other electrical components designed to provide these functions.

FIG. 2 shows a block diagram of a prior-art HPA system 200 that might be implemented on a single circuit board. HPA system 200 has a number of amplifier stages 202 connected in series via impedance-matching (Z-match) circuitry 204, which provides impedance matching between the amplifier stages. Each amplifier stage 202 includes an HPA package 206 and sensor & bias circuitry (SBC) 208, which provides such functions as control of quiescent currents and package parasitics and/or compensating for non-linear characteristics of gain as a function of input power, temperature, and/or bias. Each HPA package 206 in HPA system 200 may be an instance of HPA package 100 of FIGS. 1A and 1B. The operations of each SBC 208 are controlled by microcontroller 210, which uses the data-storage capabilities of non-volatile memory 212. Input and output Z-match circuitry 214 and 216 provide impedance matching between HPA system 200 and external electrical components.

In operation, a low-power RF input signal 218 is applied to HPA system 200 at input Z-match circuitry 214. Depending on the particular implementation, the input signal may be passed to the first HPA package 206 either directly or via its SBC 208. Similarly, depending on the particular implementation, the amplified signal generated by HPA package 206 may be passed to the first Z-match circuitry 204 either directed or via its SBC 208. Analogous pre-and/or post-amplifier processing may also be applied by each SBC 208 at each amplifier stage 202. Each amplifier stage 202 increases the amplification of the input signal until a resulting high-power RF output signal 220 appears at output Z-match circuitry 216.

Each SBC 208 includes elements such as a temperature sensor, a drain current monitor, analog-to-digital converters (A/Ds), digital-to-analog converters (D/As), and bias circuits. The SBC helps manage the temporal and thermal compensation of the high-power amplifiers and the configuration of each amplifier in one of a number of different possible operating modes (e.g., inverting amplifier, unity follower, buffer, and non-inverting preamplifier).

Microcontroller 210 receives amplifier status information (e.g., package temperature and RMS drain current measurements) from each SBC 208 and generates and sends control information (e.g., gain and/or compensation changes) to each SBC 208.

HPAs provide from 5 W to more than 300 W of output power per channel, and, for applications such as cellular base stations, HPAs often require extremely good linearity to maximize the data throughput in a given channel. One consideration in achieving linearity in these applications is the DC biasing of the transistors from which the HPAs are constructed. For metal-oxide-semiconductor, field-effect-transistor (MOSFET)-based amplifiers, for example, the quiescent drain current of the MOSFET should be held substantially constant over temperature and time for optimal performance. Typically, the target accuracy for drain-current stability over temperature is ±5%; however, ±1% is more desirable for a high-performance, wideband design. Drain-current drift in a typical amplifier will result in reduced power output, increased distortion products, and reduced phase linearity, all of which impair the performance in digital communications systems. Thus, it is important to monitor this parameter.

It is common to employ laterally-diffused metal-oxide-semiconductor (LDMOS) transistors for HPA designs. The quiescent drain current on these transistors, as an example, can be set by adjusting the gate-to-source voltage and monitoring the drain current. Ideally, drain current would be constant over temperature. However, since the gate threshold voltage (which is a component of the gate-to-source voltage) of an LDMOS device varies with temperature, some type of temperature compensation is typically used to maintain constant drain current. For example, to bias an LDMOS device #21090 from Agere Systems, of Allentown, Pa., as a class AB amplifier, the gate-to-source voltage is nominally set to 3.8 volts at 35 degrees Celsius to obtain a quiescent drain current of 400 mA. However, for every five degrees Celsius increase in junction temperature of the LDMOS device, the gate-to-source voltage should be reduced by about 0.2 volts in order to maintain the drain current at 400 mA. Typically, the drain current is first monitored during device setup when no RF input is applied to the HPA. The slope of the gate-to-source voltage versus temperature is typically constant over a normal range of operating temperature, but the intercept differs from wafer to wafer and device to device. Thus, device-specific parameters are typically stored for each HPA package, usually in a non-volatile memory, such as memory 212.

Temperature compensation is usually accomplished by table lookup or on-the-fly calculation based on stored characteristics and known drain current, gate voltage, and temperature relationships. Compensating for the temperature of LDMOS devices can be problematic, however, because of the difficulty of obtaining accurate and timely LDMOS junction-temperature information.

In exemplary prior-art HPA system 200 of FIG. 2, microcontroller 210 receives digitally sampled temperature information from each SBC 208 and adjusts the drain current of each HPA package by changing the amplifier's gate-to-source voltage based on values stored in a look-up table (LUT) in memory 212. Memory 212 contains a LUT for each HPA package 206 in HPA system 200. For each HPA package, the microcontroller uses the temperature information from the local SBC as a look-up reference into the LUT for that HPA package. The contents from the corresponding memory location are read by the microcontroller from the memory and then loaded by the microcontroller into a digital-to-analog converter (DAC) internal to the SBC associated with the HPA package. The output of the DAC determines the gate-to-source voltage of the HPA and can be used to keep the drain current relatively constant over temperature.

In other embodiments of the prior art, the SBC may alternatively or additionally monitor quiescent and total current directly. One of the disadvantages of the design of HPA system 200 is that the temperature sensor (e.g., a thermocouple) in the SBC is located external to the (typically ceramic) package body of the HPA package. Variations in the thermal-transfer characteristics of the HPA package can affect the accuracy of temperature compensation. Delays between when temperature changes occur at the transistor junction and when such changes are indicated external to the HPA package can also affect the ability of the temperature-compensation circuit to manage stabilization of drain current as a function of temperature when large changes in drain current are desired.

In conventional implementations, impedance-matching circuits 204, 214, and 216 need to be tuned to take into account variations resulting from different distances between adjacent HPA packages 206 both within a single HPA system 200 and in different instances of HPA system 200, as well as different characteristics of the individual HPA packages, which vary from wafer to wafer and from device to device. In the event of a failure of one of the HPA packages, it is insufficient to simply replace the failed package with a new one. This is because each HPA package has unique input and output impedances and unique pass-band characteristics. For this reason, HPA system 200 typically includes tunable impedance-matching circuits. Even so, if a single package on a circuit board fails, it is typically cheaper and easier to replace the entire board rather than try to adjust the board to accommodate a replacement package. These factors result in inefficiency, waste, and high cost of systems designed with these packages.

SUMMARY OF THE INVENTION

Problems in the prior art are addressed in accordance with the principles of the present invention by new techniques for packaging and configuration of electronic components, such as high-power amplifiers and other electronic components that generate relatively large amounts of heat during operation, into electronic modules.

In one embodiment, the present invention is an amplifier module comprising a substrate, as assembly having one or more integrated circuit (IC) dies mounted to the substrate, and one or more other electronic components mounted to the substrate. The assembly is adapted to receive an input signal and generate an amplified output signal. The one or more other electronic components are adapted to perform one or more amplifier-related functions. The amplifier module is adapted to be mounted to a circuit board (CB) as a distinct electronic package.

In another embodiment, the present invention is an electronic system comprising a CB and at least one amplifier module mounted to the CB. The amplifier module comprises a substrate, an assembly having one or more IC dies mounted to the substrate, and one or more other electronic components mounted to the substrate. The assembly is adapted to receive an input signal and generate an amplified output signal. The one or more other electronic components are adapted to perform one or more amplifier-related functions. The amplifier module is mounted to the CB as a distinct electronic package.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 3:
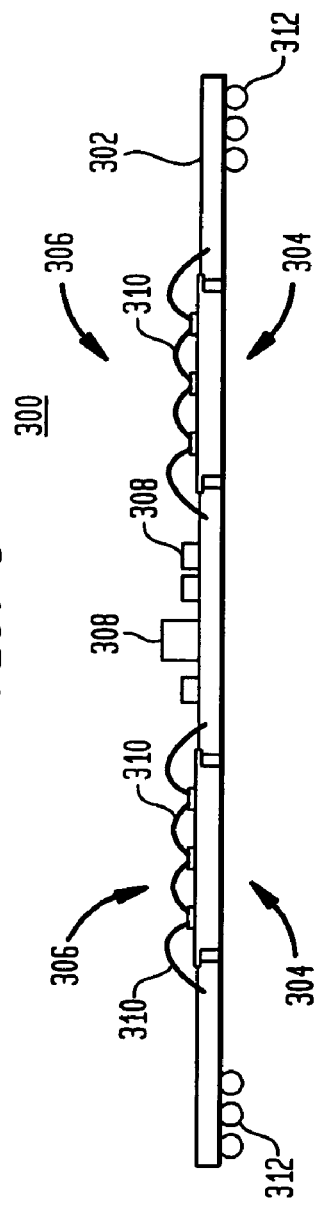
FIG. 3 shows a cross-sectional view of an HPA module, according to one embodiment of the present invention.

FIG. 3 shows a cross-sectional view of a high-power amplifier module 300, according to one embodiment of the present invention. HPA module 300 has a non-conducting substrate 302 having a number of openings 304, within each of which is mounted a die/carrier assembly 306. Also mounted on the top surface (in FIG. 3) of module substrate 302 (e.g., using solder paste) are a number of other electronic modules 308 that are electrically interconnected to each other and to the die/carrier assemblies via metal traces (not shown) running on, within, and/or through the substrate. The dies within each die/carrier assembly 306 are connected to each other and to the substrate's metal traces via wire bonds 310. Mounted on the bottom surface of module substrate 302 are solder balls 312 that form a ball grid array. A ball grid array is a distribution of metal solder spheres that is used to form electrical and/or thermal interconnections in the high-power amplifier module and an assembled electronic system. The number and pattern of solder balls in the array can vary for different ball grid array implementations.

Figure 1A:
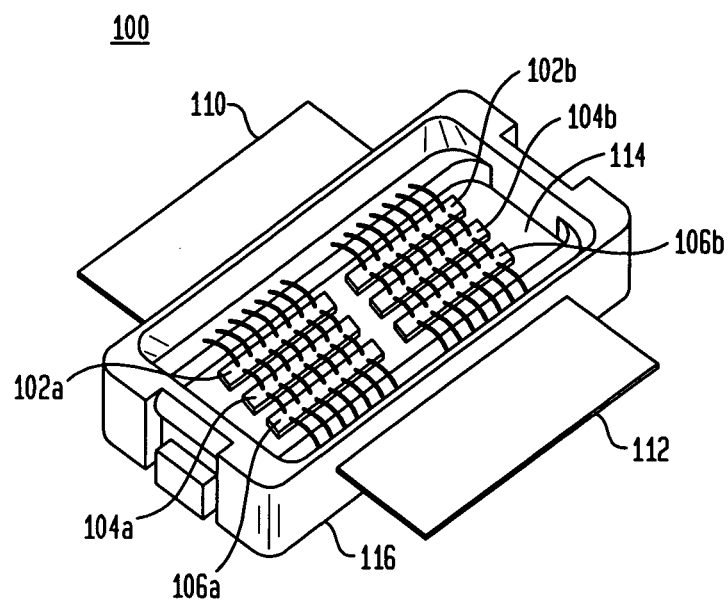
FIGS. 1A and 1B show isometric and cross-sectional views of a prior-art high-power amplifier (HPA) package.
Figure 1B:
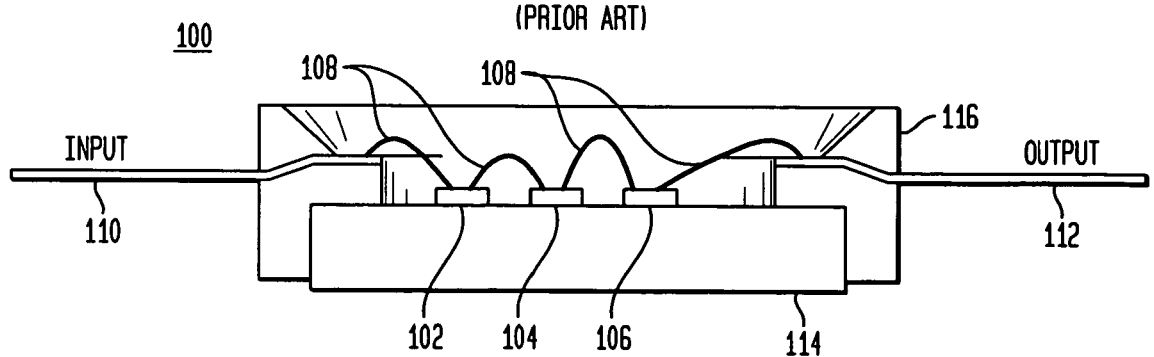
Figure 4:
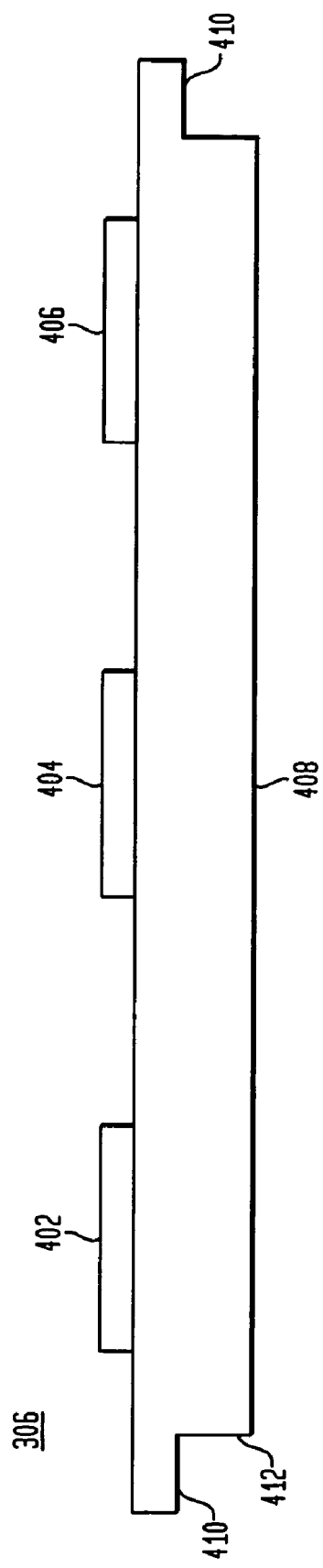
FIG. 4 shows an expanded view of one of the die/carrier assemblies of FIG. 3 before the wire bonds are added.

FIG. 4 shows an expanded view of one of the die/carrier assemblies 306 of FIG. 3 before the wire bonds are added. Similar to the prior-art die/carrier assembly of FIGS. 1A and 1B, each die/carrier assembly of FIG. 3 has one or more sets of series-connected input, amplifier, and output dies (402, 404, and 406, respectively) mounted directly to a metal carrier 408, e.g., using an electrically and thermally conducting solder. Substrate 302 of FIG. 3 is preferably made from a material that exhibits a high-dielectric constant and a good thermal-expansion match with metal carrier 408. For example, if the carrier is made of copper, then the substrate may be made from bismaleimide triazine (BT) or similar organic laminated material, or even a ceramic material having a relatively high coefficient of thermal expansion. Metal traces in the substrate connect wire bonds 310 to solder balls 312.

As shown in FIG. 4, carrier 408 has a lip 410 that extends beyond the lateral sides of the carrier body 412. The lateral dimensions of the carrier lip and body are selected such that the body fits within a corresponding opening 304 in module substrate 302 of FIG. 3, while the lip does not, such that the bottom side of the lip rests on the upper surface of the substrate to support the die/carrier assembly on the substrate. Each die/carrier assembly 306 is mounted onto module substrate 302 using an appropriate electrically conductive mechanism (e.g., solder paste).

Figure 5:
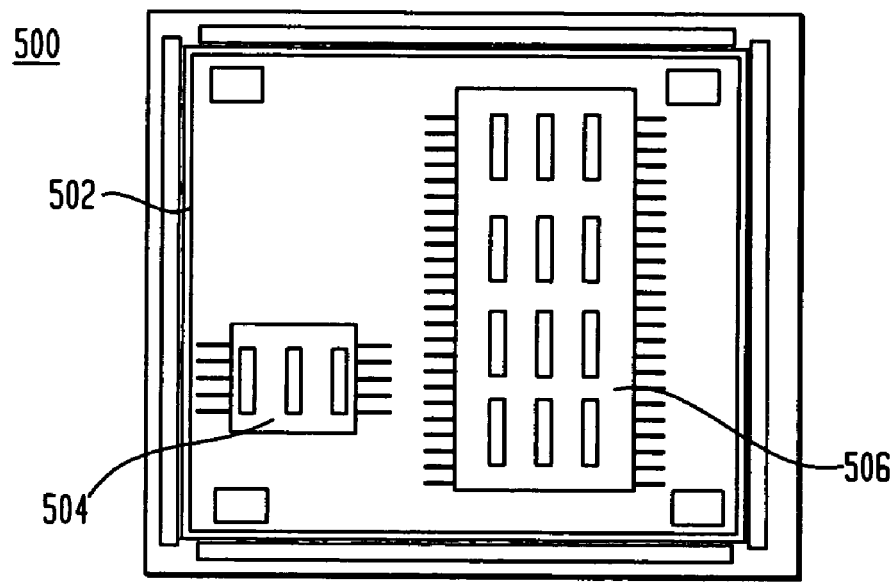
FIG. 5 shows a top view of an HPA module, according to another embodiment of the present invention.

FIG. 5 shows a top view of an HPA module 500, according to another embodiment of the present invention. In this exemplary embodiment, module substrate 502 has two openings: one of which has a die/carrier assembly 504 having a single set of series-connected input, amplifier, and output dies, while the other has a die/carrier assembly 506 having four sets of series-connected input, amplifier, and output dies.

Figure 6:
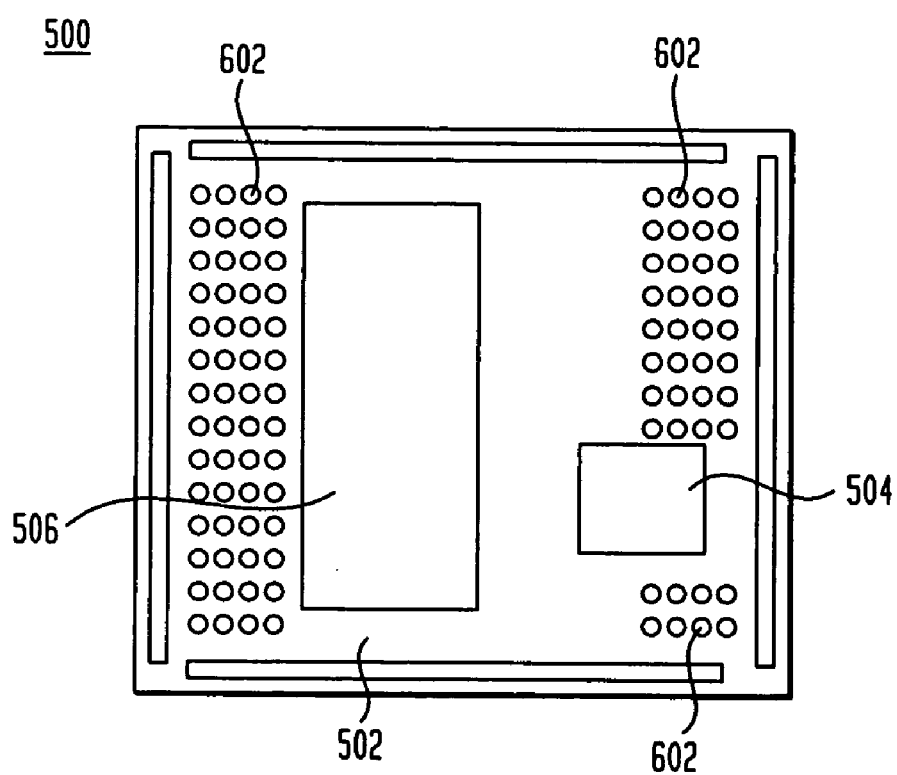
FIG. 6 shows a bottom view of the HPA module of FIG. 5.

FIG. 6 shows a bottom view of HPA module 500 of FIG. 5. In addition to the two die/carrier assemblies 504 and 506, FIG. 5 shows a ball grid array 602 having a total of 116 different solder balls. If each solder ball is electrically connected (e.g., using a via structure (not shown)) to a different metal trace on the other surface of module substrate 502, HPA module 500 can support up to 116 different input/output (I/O) signals between electronic components within HPA module 500 and external electronic components. Note that, in some implementations, two or more solder balls made be used for a single I/O signal, such as the low-power input and high-power output signals.

The following list provides an exemplary sequence for fabricating HPA modules, such as HPA module 300 of FIG. 3 and HPA module 500 of FIG. 5:

(1) Apply (e.g., screenprint) solder paste onto the module substrate.

(2) Place a metal carrier within each opening in the module substrate and one or more other electronic modules onto the upper surface of the module substrate.

(3) Reflow the solder paste (e.g., at about 250–260 C) to bond the carriers and other electronic modules to the module substrate.

(4) Attach one or more dies to each carrier using epoxy and then cure the epoxy to bond the dies to the carriers. (In an alternative fabrication sequence, the dies can be bonded to the carriers prior to mounting the carriers onto the module substrate. This alternate sequence is recommended when the die attach operation involves a die attach temperature that exceeds the capabilities of the substrate material.)

(5) Perform wire bonding between dies and between die/carrier assemblies and substrate.

(6) Encapsulate the dies and wire bonds, if desired.

(7) Attach a protective cover over the top side of the module, if desired. Note that the cover is not shown in any of the figures. The cover can be designed to cover a full or partial portion of the module and can be designed to form a hermetic seal, if desired.

(8) Attach solder balls to bottom of the module substrate. (In alternative fabrication sequences, the solder balls can be mounted to the module substrate any time after the reflow of step (3).)

At this point in the manufacturing, all of the internal electrical and mechanical connections of the HPA module are complete. The HPA module can then be mounted onto, e.g., a circuit board/chassis assembly, as one component of a larger electronic system.

Figure 7A:
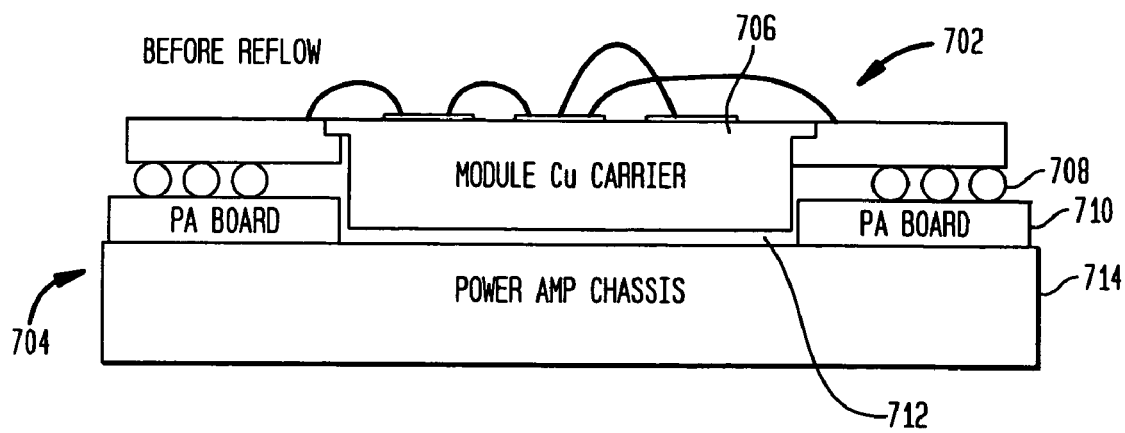
FIGS. 7A and 7B show an exemplary process of mounting an HPA module to a CB/chassis assembly.
Figure 7B:
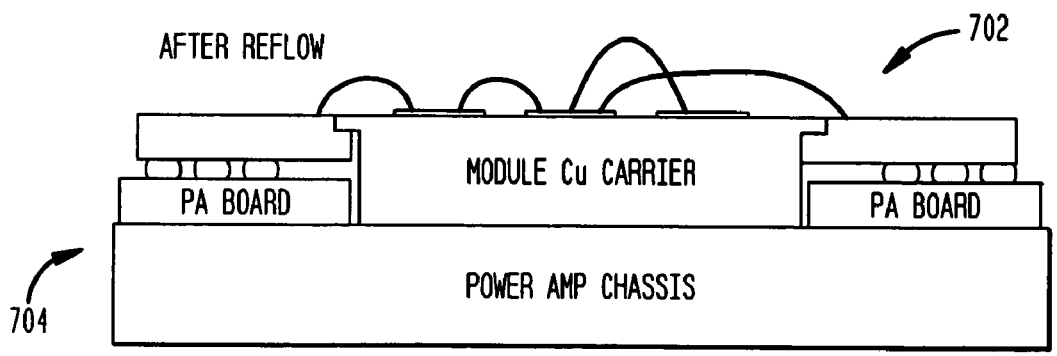

FIGS. 7A and 7B show an exemplary process of mounting an HPA module 702 to a CB/chassis assembly 704. In particular, FIG. 7A shows the configuration before a solder reflow operation is applied, while FIG. 7B shows the configuration after the solder reflow operation has been applied.

As shown in FIGS. 7A and 7B, the vertical (in FIGS. 7A and 7B) dimension of carrier 706 of HPA module 702 is such that the bottom of carrier 706 extends lower than the bottom of the mounted solder balls 708. CB 710 has an opening with lateral dimensions sufficiently large to accommodate this lower portion of carrier 706. However, the thickness of CB 710 is selected such that, before the reflow operation, the solder balls rest on the top surface of the CB, while there is a gap 712 between the bottom surface of carrier 706 and the top surface of chassis 714, as shown in FIG. 7A. Depending on the particular implementation, the gap may be at least partially filled with an electrically and thermally conducting solder paste.

During the reflow operation, the solder balls become molten, and the weight of HPA module 702 resting on top of the CB/chassis assembly partially collapses the solder balls, thereby reducing the distance between the HPA module and the CB/chassis assembly, until finally the bottom surface of carrier 706 rests on the top surface of the thermally conducting chassis 714, as shown in FIG. 7B. By carefully selecting the vertical dimensions of the various components, the amount of collapse that is applied to the solder balls can be controlled to avoid adjacent solder balls from shorting together. In an exemplary HPA module, the original solder ball diameter is 30 mils, with a target collapse height of 18 mils (which prevents ball shorts). By controlling the thickness of carrier 706 so that the bottom surface extends 12 mils below the bottom surface of CB 710, the targeted solder ball collapse height will be achieved as gap 712 reduces to zero. Likewise, if the gap is partially filled with an electrically and thermally conducting solder paste, the thickness of carrier 706 can be reduced to account for the thickness of the reflowed solder paste. Typically, 5 mils of paste are deposited in the gap, which paste reflows to a height of 3 mils.

Note that, during this one reflow operation, in addition to mounting the HPA module to the CB/chassis assembly, other components of the HPA system can be mounted to the CB/chassis assembly. Moreover, one or more HPA modules can be positioned on the CB/chassis assembly using the same automated "pick-and-place" tool used to position the other system components.

In alternative manufacturing processes, one or more HPA modules can be mounted onto a CB prior to the CB being mounted onto a chassis. Furthermore, in addition or as an alternative to using solder between the HPA module carriers and the chassis, screws may be used to ensure good thermal and/or electrical contact between the carriers and the chassis.

Figure 2:
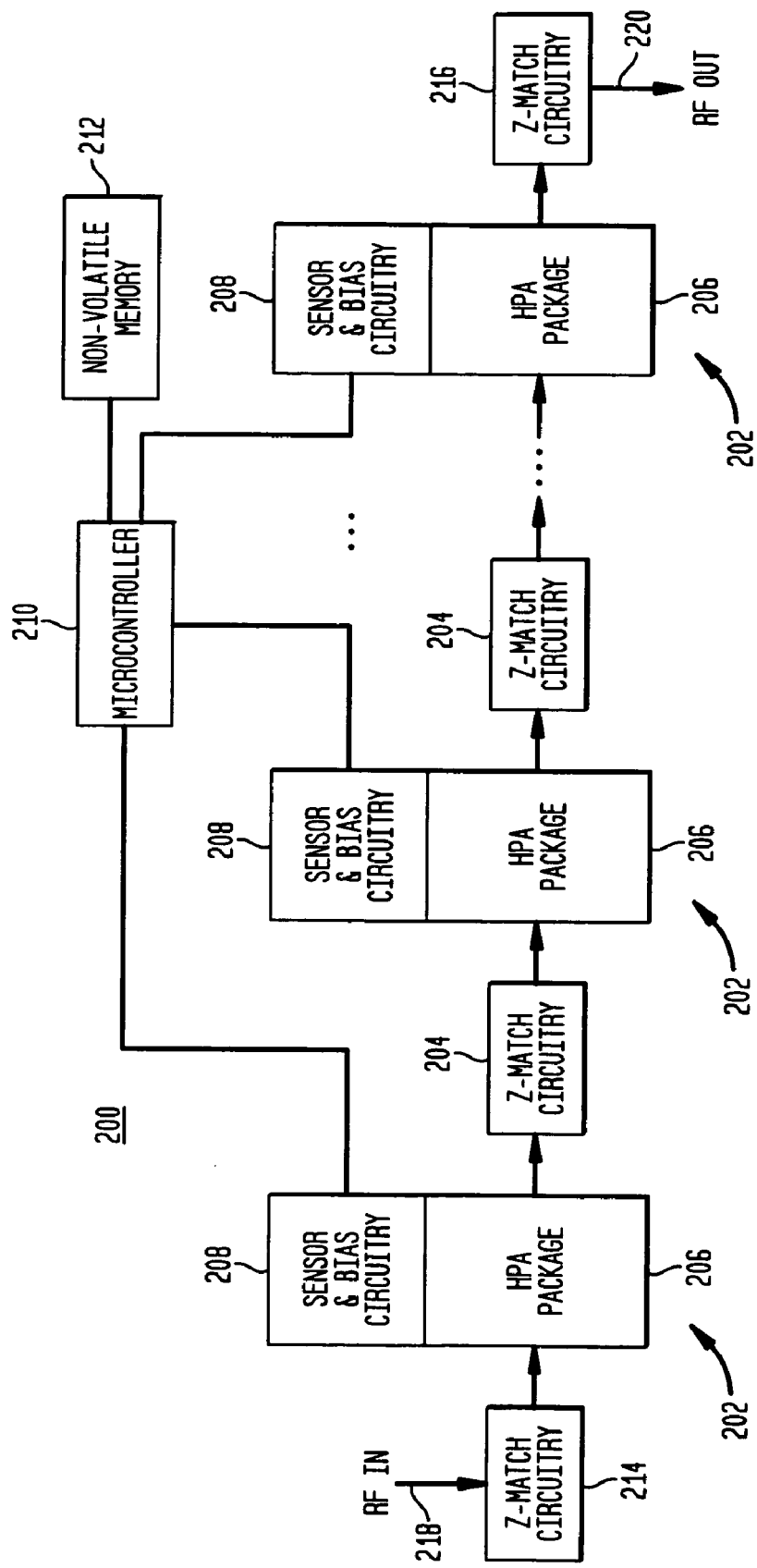
FIG. 2 shows a block diagram of a prior-art HPA system that might be implemented on a single circuit board.

As shown in FIG. 3 and as is apparent in FIG. 5, the substrates used in HPA modules may have room to accommodate one or more electronic components in addition to the die/carrier assemblies. These electronic components can include circuitry that performs the impedance-matching and control functions of Z-match circuitry 204 and sensor & bias circuitry 208 of FIG. 2, all within a single HPA module. In that way, a single HPA module of the present invention can provide the functionality of multiple, different electronic components of the prior art, such as one or more HPA packages, like HPA package 206 of FIG. 2, and their associated external components, such as impedance-matching circuitry 204, 214, 216 and sensor & bias circuitry 208 of FIG. 2.

Figure 8:
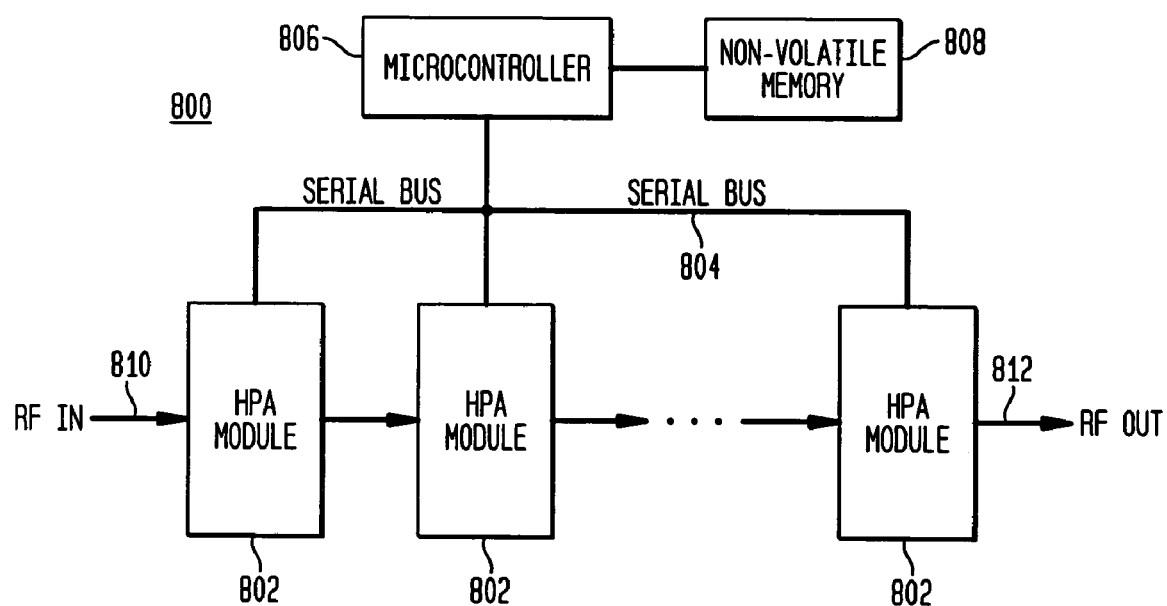
FIG. 8 shows a block diagram of an HPA system, according to one embodiment of the present invention.

FIG. 8 shows a block diagram of an HPA system 800, according to one embodiment of the present invention. HPA system 800 has one or more HPA modules 802 interconnected in series and connected via serial bus 804 to a microcontroller 806 with associated non-volatile memory 808. Each HPA module 802 may be implemented using an HPA module of the present invention.

In operation, a (e.g., low-power) RF input signal 810 is applied to the first HPA module 800, which amplifies the input signal and applies the resulting amplified signal to the next, downstream HPA module, until the last HPA module provides its output as a (e.g., high-power) RF output signal 812. Microcontroller 806 communicates with each HPA module 802 using serial bus 804. Each HPA module 802 includes a unique identifier allowing it to be uniquely addressed via the microcontroller. The microcontroller receives aggregate status or interrupt information (e.g., current, low, high, and average temperature, and out-of-range exception alarms) from each HPA module. The microcontroller also sends aggregate control (e.g., gain setting or bias current settings) to each HPA module. Each HPA module internally compensates itself for temperature changes and also provides input and output impedance matching internal to the HPA module.

Figure 9:
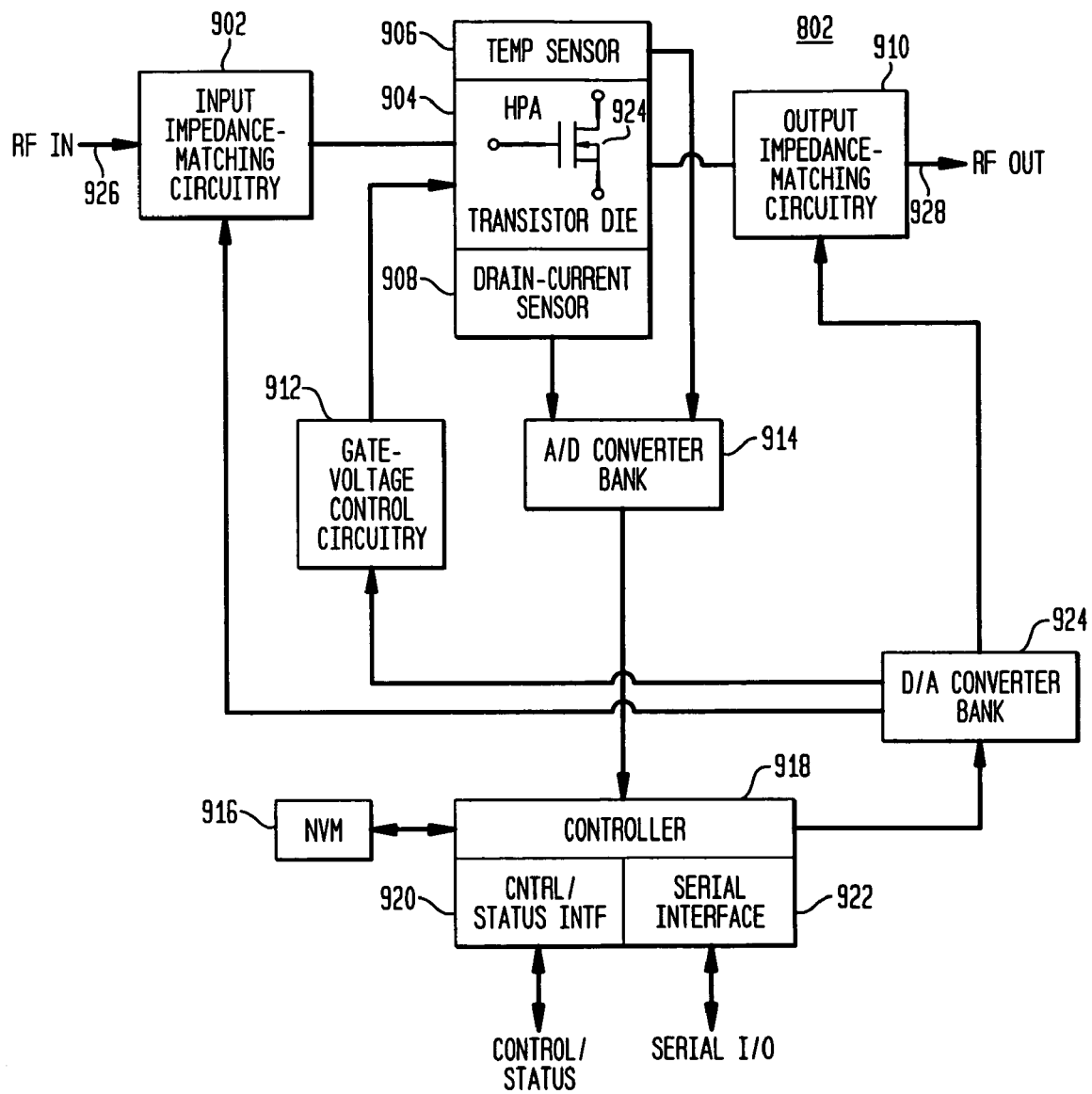
FIG. 9 shows a block diagram of the electronics within each HPA module of FIG. 8, according to one possible implementation.

FIG. 9 shows a block diagram of the electronics within each HPA module 802 of FIG. 8, according to one possible implementation. HPA module 802 includes input impedance-matching circuitry 902, high-power amplifier 904 (e.g., having one or more sets of series-connected input, amplifier, and output dies), temperature sensor 906, drain-current sensor 908, output impedance-matching circuitry 910, gate-voltage control circuitry 912, A/D converter bank 914, non-volatile memory 916, digital logic controller 918, control/status interface 920, serial interface 922, and D/A converter bank 924. HPA 904 includes one or more (e.g., thousands) of transistors CX and potentially other interface circuitry (e.g., for configuring the transistors into one of a variety of amplifier modes such as buffer or high gain, although in various embodiments, this configuration is also programmable to a greater or lesser extent).

In operation, RF input signal 926 is coupled to impedance-matching circuitry 902 from outside HPA module 802. Input signal 926 is typically carried to the HPA module on a coaxial cable that has an impedance of about 50 ohms. The impedance-matching circuitry provides an impedance transformation at the intended passband of the module from the coaxial cable's 50-ohm impedance to the input impedance of the transistor circuit of HPA 904 (e.g., one to two ohms). Impedance matching minimizes reflections, noise, and power loss, as would be understood by one skilled in the art.

Temperature sensor 906 is preferably mounted as close to HPA 904 as possible, and may even physically touch HPA 904. This close proximity between the HPA and the temperature sensor provides an advantage to the module in terms of temperature-sensing accuracy and timeliness. The temperature sensor may be implemented using a diode external to the HPA dies, but, as would be understood to one skilled in the art, the temperature sensor could alternatively be implemented in a number of different ways (e.g., as a diode that is part of an HPA die or as a thermocouple external to the die) to retain the advantages of proximity.

Drain-current sensor 908 is similarly proximate to (or, alternatively, part of) HPA 904. This provides for accurate determination of drain current through the HPA's transistors, particularly at module characterization time (as explained later). The drain current is a function of the gate-to-source voltage, which, in turn, is a function of both the transistor junction temperature as well as the control setting provided to gate-voltage control circuitry 912 by controller 918 via a DAC in D/A converter bank 924. Sensors 906 and 908 are each coupled to an ADC within A/D converter bank 914, where the sensors' analog voltage or current signals are converted to digital form and passed to local controller 918.

The output of HPA 904 is coupled to output-impedance matching circuitry 910, which, in turn, provides RF output signal 928 of module 802. Output signal 928 is typically carried away from module 802 on a coaxial cable that has an impedance of about 50 ohms. Impedance-matching circuitry 910 provides an impedance transformation at the intended passband of the HPA module from the output impedance of HPA 904 (e.g., typically one to two ohms) to the coaxial cable's 50-ohm impedance.

The characteristics of input and output impedance-matching circuitry 902 and 910 are tuned by controller 918 using two DACs within D/A converter bank 924.

Controller 918 is coupled to control/status interface 920, serial interface 922, and non-volatile (e.g., random access) memory (NVM) 916.

During module characterization, various characteristics of the module are sampled and stored in memory 916 along with default parameters and/or operational code for controller 918. In various embodiments, the operation of the module can be influenced by module-external settings. For example, pins of controustatus interface 920 that are tied to logical ones or zeros, power-on reset circuitry, module-external dip switches, or equivalent. Operation can also be influenced by information written to registers within controller 918 or memory 916 via serial interface 922 by an external microcontroller, or, for example, via a simple-network-management-protocol (SNMP) proxy unit.

Characteristics stored in memory 916 can include the HPA's quiescent drain current as a function of gate voltage measured at a particular junction temperature for the transistor, the junction temperature being substantially within the operating temperature range of the transistor.

For many field-effect transistors, for example, to maintain a constant drain current, the gate-to-source voltage is reduced by some voltage increment per degree of transistor junction temperature increase. The slope of the gate-to-source-voltage-versus-temperature graph is substantially constant over the operating temperature of the transistor. However, the actual gate-to-source voltage corresponding to a particular drain current at a specific temperature (e.g., the gate-to-source-voltage intercept of the gate-to-source-voltage-versus-temperature graph for the particular drain current) varies from device to device. This difference in intercept values between devices makes each transistor circuit unique. However, by recording this intercept and/or programming the specific characteristics of the device into the memory, it is possible to make each module have substantially identical gain characteristics, if so desired, from the perspective of the outside world.

Similarly, the impedance variations of the transistor circuits are correctable via controller 918 built into each module. This makes it easier, for example, to replace a failed module on a multiple-module circuit pack in the field. This is because no special tuning of the circuit-pack interface circuitry is required to accommodate the new module relative to the one it replaced.

To help clarify these concepts, assume, for example, it is desirable to configure and operate amplifier module 802 as an AB-class amplifier. Such an operation corresponds to biasing transistors CX with some target quiescent drain current (e.g., 400 mA) and providing appropriate feedback circuitry on the module. To appropriately bias the transistor, controller 918 is configured for the target drain current via control/status interface 920, serial interface 922, or via factory default parameters stored in memory 916. Recall, as discussed before, that memory 916 can also be pre-programmed (e.g., at the factory) with the slope and intercept information for the gate-to-source-voltage-versus-temperature characteristics of transistors CX corresponding to an anticipated range of drain currents for the device. Portions of this information are used by controller 918 in setting and maintaining the operating characteristics of the module.

Figures 10, 11:
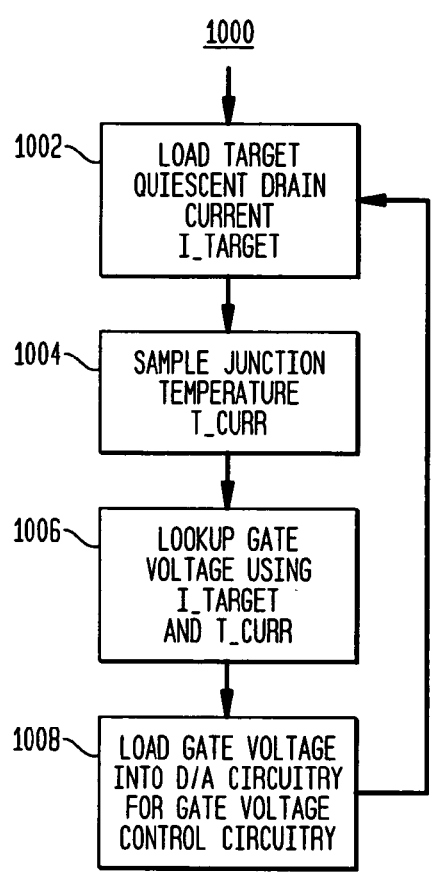
FIG. 10 illustrates exemplary algorithm executed by the controller of FIG. 9 to set and maintain the amplifier class of the HPA module of FIG. 8 over changes in temperature.
FIG. 11 represents a memory section of the memory of FIG. 9 used for storing information used by the algorithm of FIG. 10.

FIG. 10 illustrates exemplary algorithm 1000 executed by controller 918 of FIG. 9 to set and maintain the amplifier class of module 802 over changes in temperature. FIG. 11 represents memory section 1100 of memory 916 used for storing information used by algorithm 1000.

In step 1002, the target quiescent-drain-current parameter I_TARGET for the module is loaded into controller 918 from a control location in memory 916. I_TARGET could have been loaded at the factory as a default parameter controlling the class of the amplifier, in the field at configuration time, or dynamically via the control/status interface or serial interface of the module. The value (e.g., 401 mA) of this parameter corresponds to the quiescent drain current to be maintained by the module controller to preserve the class-AB-amplifier characteristics of the module.

In step 1004, controller 918 samples the current junction temperature T_CURR of transistors CX using temperature sensor 906 and A/D circuits 914.

Next, in step 1006, I_TARGET and T_CURR are used as lookup values in memory section 1100. I_TARGET is first compared to entries in the column of the memory section labeled "drain current" in the illustration of FIG. 11. If I_TARGET does not match an entry in the drain-current column exactly, then a value in memory section 1100 that is closest to the value of I_TARGET is selected. In this case, the closest value in the drain-current column is 400 mA. Note that the value of 400 mA is common to all the rows in subsection 1102 of memory section 1100, thus I_TARGET identifies not a single row of memory section 1100, but instead the entire subsection 1102 of memory section 1100. Next, T_CURR is used as a lookup value within subsection 1102 of the memory identified using I_TARGET. The value of T_CURR is compared to all values within subsection 1102 within the column labeled "Junction Temperature" in the illustration of FIG. 11. If the value does not match an entry directly, then the row with the closest value is selected.

If, for example, the sampled junction-temperature T_CURR is 34 degrees Celsius, then the closest entry in memory subsection 1102 is 35 degrees Celsius. Thus, row #7 of memory section 1100 is ultimately selected by the I_TARGET and T_CURR lookups of step 1006. Alternatively, instead of selecting the nearest stored value, interpolation between stored values can be performed, as would be understood to one skilled in the art.

Next, in step 1008, the gate-to-source voltage (VGS) from the row of memory section 1100 that was selected in step 1006 is loaded from memory 916 into controller 918. From there, VGS is loaded into a DAC in D/A converter bank 924, the output of which converter is coupled to gate-voltage control circuitry 912. In this way, the gate-to-source voltage gets changed to an analog representation of the value that was looked up in memory. In most cases, the actual values stored in memory are integer approximations and/or variants of the actual analog voltage that is applied to the gate of transistors CX. This is to accommodate offsets and scaling associated with the specific hardware of the module as would be understood to one skilled in the art. After step 1008, and optionally after some delay, the algorithm loops back to step 1002.

In alternative implementations, tradeoffs are made between storage of the drain-current, junction-temperature, and gate-to-source-voltage (ITV) relationships in memory versus calculation of VGS as a function of gate-to-source voltage and junction temperature on the fly.

In various embodiments, other parameters, such as the age of the transistor(s) within a module, and information regarding how the ITV relationship is affected by, for example, aging, are also stored. In these embodiments, controller 918 can adjust the calculation of VGS based on the age of the transistor. In one variant, controller 918 contains a battery that powers a clock, which clock increments a counter. The value of the counter is interpreted as an age for the device. In another variant, the memory is initialized with a date-code of manufacture. In operation, an external manager such as an SNMP proxy, can load a current date-code into one of the registers of controller 918 or into one of the storage locations of memory 916. Controller 918 can then calculate a difference between the date-code of manufacture and the current data-code to determine an age for the device. Controller 918 then adjusts the calculation of VGS according to a predetermined aging relationship stored in memory.

In various embodiments of the invention, a unique identifier for the module is stored in the module's memory at the time of manufacture of the module. This unique identifier can be read from the device at any time. This unique identifier can also be stored by the manufacturer in a database and used to identify characteristics of the module such as manufacture date, wafer-fabrication facility, and lot.

In some embodiments of the present invention, a calibration of the ITV characteristics of the device can be performed by (1) taking the device offline, (2) shunting a test or calibration signal into the input of the module internally, (3) measuring the drain current, temperature, and gate-to-source voltage, and (4) using this information to update the ITV characteristics stored in memory 916.

In one or more embodiments of the present invention, controller 918 is used to control the input and output impedances of the module, either during circuit-pack configuration or dynamically as a function of temperature. In these embodiments, configuration information is loaded from outside the module for input and output impedances (e.g., 50 ohms or 75 ohms). Controller 918 makes use of factory-programmed parameters stored in memory 916 to set various voltage and current values in the input and output impedance-matching circuitry, 902 and 910, respectively, by writing to the appropriate registers in D/A converter bank 924.

In various embodiments, HPA module 802 can contain one or more transistor dies, each with autonomous local control and compensation circuitry, the transistor dies arranged to form multi-stage (e.g., preamplifier and output driver), plug-and-play amplifiers. For example, a first transistor die configured as a preamplifier stage with 15 dB of gain and a second transistor or die configured as an output driver stage with 13 dB of gain can be combined within a single module to create a module with 28 dB of gain and a 50 dBm output power.

Although the background of the invention was discussed in the context of high-power amplifiers based on LDMOS transistors, the invention is not limited thereto and any suitable power-amplifying device could be utilized in the invention.

Although the present invention has been described in the context of high-power amplifiers, the invention can also be implemented in other contexts and is especially useful for applications having one or more electronic components that generate a relatively large amount of heat during operation.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the steps in the following method claims, if any, are recited in a particular sequence with corresponding labeling, unless the claim recitations otherwise imply a particular sequence for implementing some or all of those steps, those steps are not necessarily intended to be limited to being implemented in that particular sequence.

We claim:

1. An amplifier module, comprising:
   a substrate;
   an assembly having one or more integrated circuit (IC) dies mounted to the substrate and adapted to receive an input signal and generate an amplified output signal; and
   one or more other electronic components mounted to the substrate and adapted to perform one or more amplifier-related functions, wherein:
      the amplifier module is adapted to be mounted to a circuit board (CB) as a distinct electronic package; and
      the one or more other electronic components comprise a controller adapted to control amplifier operations within the module and at least one of:
         input impedance-matching circuitry adapted to provide the amplifier module with a desired input impedance level, wherein, if the one or more other electronics components comprise the input impedance-matching circuitry, then the controller is adapted to generate control signals for controlling the input impedance level provided by the input impedance-matching circuitry;

output impedance-matching circuitry adapted to provide the amplifier module with a desired output impedance level, wherein, if the one or more other electronics components comprise the output impedance-matching circuitry, then the controller is adapted to generate control signals for controlling the output impedance level provided by the output impedance-matching circuitry; and a drain-current sensor adapted to sense a drain current of the assembly, wherein, if the one or more other electronics components comprise the drain-current sensor, then the controller is adapted to generate control signals for controlling the amplifier operations within the module based on the drain current sensed by the drain-current sensor.

2. The invention of claim 1, wherein the assembly is a die/carrier assembly comprising one or more sets of three electrically connected IC dies mounted to a carrier, each set of three IC dies comprising an input die, an amplifier die, and an output die.

3. The invention of claim 1, wherein the one or more other electronic components further comprise at least one of:
a temperature sensor adapted to sense temperature near the assembly;
gate-voltage control circuitry adapted to control a gate voltage of the assembly;
a bank of one or more A/D converters, each adapted to convert an analog signal into a digital signal;
a bank of one or more D/A converters, each adapted to convert a digital signal into an analog signal;
a memory adapted to store data; and
at least one interface providing input/output (I/O) access for the module.

4. The invention of claim 3, wherein the one or more other electronic components further comprise the input impedance-matching circuitry, the output impedance-matching circuitry, the temperature sensor, the drain-current sensor, the gate-voltage control circuitry, the bank of one or more A/D converters, the bank of one or more D/A converters, the memory, and the at least one interface.

5. The invention of claim 3, wherein:
the other electronic components further comprise the temperature sensor; and the controller is adapted to:
receive a sensed temperature signal from the temperature sensor;
generate a compensation signal for the assembly as a function of the sensed temperature signal and predetermined characteristics of the assembly; and
apply the compensation signal to control operations of the assembly to compensate for changes in temperature.

6. The invention of claim 5, wherein:
the other electronic components further comprise the gate-voltage control circuitry;
the compensation signal is applied to the gate-voltage control circuitry; and
the gate-voltage control circuitry adjusts the gate voltage of the assembly based on the compensation signal to control gain of the assembly.

7. The invention of claim 6, wherein:
the other electronic components further comprise the memory;

the predetermined characteristics of the assembly are represented in a table stored in the memory;
the table relates gate voltage to temperature for different gain levels; and
the controller is adapted to access the table based on the sensed temperature signal to generate the compensation signal.

8. The invention of claim 5, wherein the controller is adapted to determine minimum and maximum temperature levels over time.

9. The invention of claim 3, wherein:
the other electronic components further comprise the memory;
the memory stores identification information for the amplifier module.

10. The invention of claim 9, wherein the identification information comprises at least one of a date code, a lot identifier, a manufacturer identifier, and a fabrication facility identifier.

11. The invention of claim 3, wherein:
the other electronic components further comprise the at least one interface; and
the at least one interface is a simple network management protocol (SNMP) or SNMP-proxy interface.

12. The invention of claim 3, wherein:
the one or more other electronic components further comprise the temperature sensor; and
the temperature sensor is part of the assembly.

13. The invention of claim 1, wherein the other electronic components further comprise the input impedance-matching circuitry and the output impedance-matching circuitry.

14. An electronic system comprising:
a CB; and
at least one amplifier module mounted to the CB and comprising:
a substrate;
an assembly having one or more integrated circuit (IC) dies mounted to the substrate and adapted to receive an input signal and generate an amplified output signal; and
one or more other electronic components mounted to the substrate and adapted to perform one or more amplifier-related functions, wherein:
the amplifier module is mounted to the CB as a distinct electronic package; and
the one or more other electronic components comprise a controller adapted to control amplifier operations within the module and at least one of:
input impedance-matching circuitry adapted to provide the amplifier module with a desired input impedance level, wherein, if the one or more other electronics components comprise the input impedance-matching circuitry, then the controller is adapted to generate control signals for controlling the input impedance level provided by the input impedance-matching circuitry;
output impedance-matching circuitry adapted to provide the amplifier module with a desired output impedance level, wherein, if the one or more other electronics components comprise the output impedance-matching circuitry, then the controller is adapted to generate control signals for controlling the output impedance level provided by the output impedance-matching circuitry; and a drain-current sensor adapted to sense a drain current of the assembly, wherein, if the one or more other electronics components comprise t controller is adapted to generate control signals for controlling the amplifier operations within the module based on the drain current sensed by the drain-current sensor.

15. The invention of claim 14, wherein the assembly is a die/carrier assembly comprises one or more sets of three electrically connected IC dies mounted to a carrier, each set of three IC dies comprising an input die, an amplifier die, and an output die.

16. The invention of claim 14, wherein the one or more other electronic components further comprise at least one of:
   a temperature sensor adapted to sense temperature near the assembly;
   gate-voltage control circuitry adapted to control a gate voltage of the assembly;
   a bank of one or more A/D converters, each adapted to convert an analog signal into a digital signal;
   a bank of one or more D/A converters, each adapted to convert a digital signal into an analog signal;
   a memory adapted to store data;
   at least one interface providing input/output (I/O) access for the module.

17. The invention of claim 16, wherein the one or more other electronic components further comprise the input impedance-matching circuitry, the output impedance-matching circuitry, the temperature sensor, the drain-current sensor, the gate-voltage control circuitry, the bank of one or more A/D converters, the bank of one or more D/A converters, the memory, and the at least one interface.

18. The invention of claim 14, wherein the system comprises:
   a plurality of electrically connected amplifier modules mounted to the CB; and
   a microcontroller mounted to the CB and electrically connected to control operations of the amplifier modules.

19. The invention of claim 1, wherein the one or more other electronic components further comprise the drain-current sensor.

20. The invention of claim 14, wherein the one or more other electronic components further comprise the drain-current sensor.

21. The invention of claim 14, wherein the one or more other electronic components further comprise the input impedance-matching circuitry and the output impedance-matching circuitry.

22. An amplifier module, comprising:

a substrate;

an assembly having one or more integrated circuit (IC) dies mounted to the substrate and adapted to receive an input signal and generate an amplified output signal; and one or more other electronic components mounted to the substrate and adapted to perform one or more amplifier-related functions, wherein the amplifier module is adapted to be mounted to a circuit board (CB) as a distinct electronic package, wherein:

the other electronic components comprise the temperature sensor and the controller;

the controller is adapted to:
   receive a sensed temperature signal from the temperature sensor;
   generate a compensation signal for the assembly as a function of the sensed temperature signal and predetermined characteristics of the assembly;
   apply the compensation signal to control operations of the assembly to compensate for changes in temperature; and
   determine minimum and maximum temperature levels over time.

* * * * *

UNITED STATES PATENT AND TRADEMARK OFFICE
CERTIFICATE OF CORRECTION

PATENT NO.         : 7,215,204 B2                                              Page 1 of 1
APPLICATION NO. : 11/055711
DATED              : May 8, 2007
INVENTOR(S)        : Timothy B. Bambridge et al.

It is certified that error appears in the above-identified patent and that said Letters Patent is hereby corrected as shown below:

In column 15, line 3, replace "t" with --the drain-current sensor, then the--.

Signed and Sealed this

Seventeenth Day of July, 2007

JON W. DUDAS
*Director of the United States Patent and Trademark Office*